United States Patent
Schiano

(10) Patent No.: US 7,511,496 B2
(45) Date of Patent: Mar. 31, 2009

(54) QUADRUPOLE RESONANCE USING NARROWBAND PROBES AND CONTINUOUS WAVE EXCITATION

(75) Inventor: Jeffrey L. Schiano, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 11/679,575

(22) Filed: Feb. 27, 2007

(65) Prior Publication Data

US 2008/0036462 A1    Feb. 14, 2008

Related U.S. Application Data

(60) Provisional application No. 60/870,887, filed on Dec. 20, 2006, provisional application No. 60/777,459, filed on Feb. 27, 2006.

(51) Int. Cl.
*G01V 3/00* (2006.01)
(52) U.S. Cl. ........................... 324/312; 324/307
(58) Field of Classification Search ......... 324/300–322; 600/410–435
See application file for complete search history.

(56) References Cited

U.S. PATENT DOCUMENTS

| | | | |
|---|---|---|---|
| 5,254,950 A | | 10/1993 | Fan et al. |
| 5,351,007 A | | 9/1994 | Withers et al. |
| 5,500,591 A | * | 3/1996 | Smith et al. ............... 324/307 |
| 5,585,723 A | | 12/1996 | Withers |
| 5,719,499 A | * | 2/1998 | Chandrakumar ............ 324/322 |
| 5,789,257 A | * | 8/1998 | Tapper et al. ............... 436/173 |
| 5,814,992 A | | 9/1998 | Busse-Grawitz et al. |
| 5,886,525 A | * | 3/1999 | Yesinowski et al. ......... 324/321 |
| 6,100,688 A | | 8/2000 | Smith et al. |
| 6,344,818 B1 | | 2/2002 | Markov et al. |
| 6,392,408 B1 | | 5/2002 | Barrall et al. |
| 6,411,208 B1 | * | 6/2002 | Buess et al. ............... 340/540 |
| 6,573,766 B1 | | 6/2003 | Humphrey et al. |
| 6,688,127 B2 | | 2/2004 | Laubacher et al. |
| 6,711,912 B2 | | 3/2004 | Laubacher et al. |
| 6,956,476 B2 | * | 10/2005 | Buess et al. ............... 340/540 |
| 7,106,058 B2 | | 9/2006 | Wilker et al. |
| 7,109,714 B2 | | 9/2006 | Rudakov et al. |
| 7,132,942 B1 | * | 11/2006 | Buess et al. ............... 340/540 |
| 7,148,684 B2 | | 12/2006 | Laubacher et al. |
| 2002/0190715 A1 | | 12/2002 | Marek |
| 2003/0001570 A1 | * | 1/2003 | Buess et al. ............... 324/307 |

(Continued)

OTHER PUBLICATIONS

Wilker, C., J.D. McCambridge, D.B. Laubacher, R.L. Alvarez, J.S. Guo, C.F. Carter III, M.A. Pusateri, and J.L. Schiano. "HTS Sensors for NQR Spectroscopy." IEEE Microwave Symposium Digest 2004, vol. 1, pp. 143-146.

(Continued)

*Primary Examiner*—Dixomara Vargas
(74) *Attorney, Agent, or Firm*—Gifford, Krass, Sprinkle, Anderson & Citkowski, P.C.

(57) ABSTRACT

The use of a superconducting resonator with continuous-wave (CW) excitation allows low-noise quadrupole resonance (QR) detection without the need for a lock-in amplifier. This allows detection times to be greatly reduced. Hence, for the first time, a CW QR spectrometer using a superconducting resonator can be used in a portable device, such as a hand-held wand for detecting explosives.

11 Claims, 6 Drawing Sheets

U.S. PATENT DOCUMENTS

| | | | |
|---|---|---|---|
| 2003/0119677 | A1 | 6/2003 | Qiyan et al. |
| 2004/0245988 | A1* | 12/2004 | Laubacher ................. 324/316 |
| 2005/0046420 | A1 | 3/2005 | Laubacher et al. |
| 2005/0073307 | A1* | 4/2005 | Manneschi ................. 324/316 |
| 2005/0104593 | A1 | 5/2005 | Laubacher |
| 2005/0122109 | A1 | 6/2005 | Wilker et al. |
| 2005/0140371 | A1 | 6/2005 | Alvarez |
| 2005/0206382 | A1 | 9/2005 | Laubacher et al. |
| 2005/0222504 | A1 | 10/2005 | Otvos et al. |
| 2005/0270028 | A1 | 12/2005 | Alvarez et al. |
| 2006/0009172 | A1 | 1/2006 | Shamsaifar |
| 2006/0012371 | A1 | 1/2006 | Laubacher et al. |
| 2006/0017439 | A1 | 1/2006 | Laubacher et al. |
| 2006/0021437 | A1 | 2/2006 | Kaduchak et al. |
| 2006/0082368 | A1 | 4/2006 | McCambridge |
| 2006/0119357 | A1 | 6/2006 | Alvarez et al. |
| 2007/0211922 | A1* | 9/2007 | Crowley et al. ............. 382/115 |
| 2008/0001602 | A1* | 1/2008 | Schiano et al. .............. 324/318 |
| 2008/0111550 | A1* | 5/2008 | Freytag ..................... 324/322 |

OTHER PUBLICATIONS

Bendall, M.R. "Portable NMR Sample Localization Method Using Inhomogeneous rf Irradiation Coils." Chemical Physics Letters 1983, vol. 99, pp. 310-315.

Garroway, A.N., M.L. Buess, J.B. Miller, B.H. Suits, A.D. Hibbs, G.A. Barrall, R. Matthews, L.J. Burnett. "Remote Sensing by Nuclear Quadrupole Resonance." IEEE Transactions on Geoscience and Remote Sensing 2001, vol. 39, pp. 1108-1118.

Withers, R.S., G.C. Liang, B.F. Cole, and M. Johansson. "Thin-Film HTS Probe Coils for Magnetic-Resonance Imaging." IEEE Transactions on Applied Superconductivity 1993, vol. 3, pp. 2450-2453.

Suits, B.H., A.N. Garroway, and J.B. Miller. "Super-Q Detection of Transient Magnetic Resonance Signals." Journal of Magnetic Resonance 1998, vol. 132, pp. 54-64.

Tan, Y., S.L. Tantum, L.M. Collins. "Cramer-Rao Lower Bound for Estimating Quadrupole Resonance Signals in Non-Gaussian Noise." IEEE Signal Processing Letters 2004, vol. 11, pp. 490-493.

Darrasse, L. and J.C. Ginefri. "Perspectives with cryogenic RF probes in biomedical MRI." Biochimie 2003, vol. 85, pp. 915-937.

Black, R.D., P.B. Roemer, and O.M. Mueller. "Electronics for a High Temperature Superconducting Receiver System for Magnetic Resonance Microimaging." IEEE Transactions on Biomedical Engineering 1994, vol. 41, pp. 195-197.

Black, R.D., P.B. Roemer, A. Mogro-Campero, L.G. Turner, and K.W. Rohling. "High temperature superconducting resonator for use in nuclear magnetic resonance microscopy." Applied Physics Letters 1993, vol. 62, pp. 771-773.

Rudakov, T.N., A.V. Belyakov, and V.T. Mikhaltsevich. "A low-frequency instrument for remote nuclear quadrupole resonance experiments." Measurement Science and Technology 1997, vol. 8, pp. 444-448.

Bendall, M.R., A. Connelly, and J.M. McKendry. "Elimination of Coupling between Cylindrical Transmit Coils and Surface-Receive Coils for in Vivo NMR." Magnetic Resonance in Medicine 1986, vol. 3, pp. 157-163.

* cited by examiner

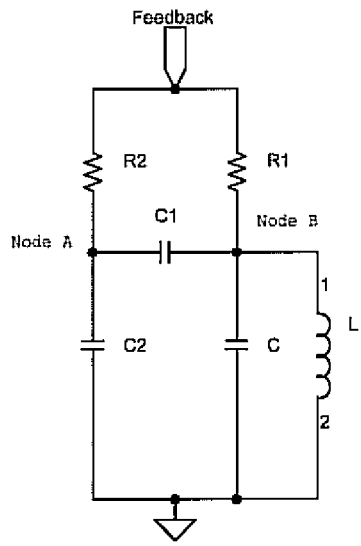
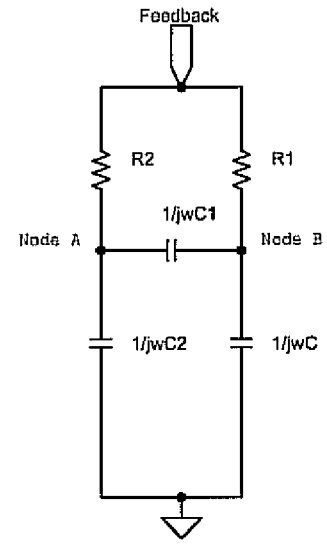
FIG – 3A    FIG – 3B
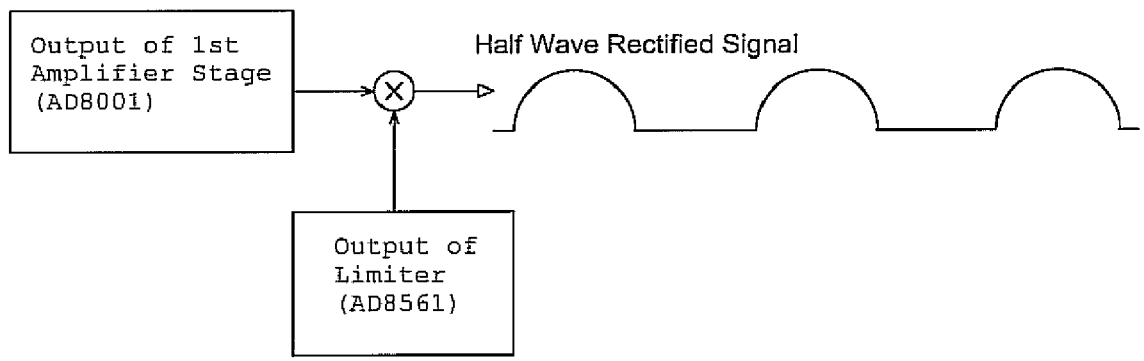
FIG – 3C

QUADRUPOLE RESONANCE USING NARROWBAND PROBES AND CONTINUOUS WAVE EXCITATION

REFERENCE TO RELATED APPLICATIONS

This application claims priority from U.S. Provisional Patent Application Ser. Nos. 60/777,459, filed Feb. 27, 2006 and Ser. No. 60/870,887, filed Dec. 20, 2006, the entire contents of which are incorporated herein in their entirety by reference.

FIELD OF THE INVENTION

The present invention relates to quadrupole resonance (QR), in particular to apparatus and methods for QR detection of materials using continuous-wave (CW) excitation.

BACKGROUND OF THE INVENTION

QR allows noninvasive, short-range detection of materials containing nitrogen, including many explosives. Unlike other technologies, QR detection systems can discriminate among different types of explosives and distinguish them from benign nitrogen compounds, because the QR response from each nitrogen compound has a unique spectral signature.

There is a great current need to detect explosives concealed within containers, such as luggage, mail, improvised explosive devices, and minimal metal landmines. At the present time, x-ray detection is the primary technology used at aviation security checkpoints. X-ray detection systems reveal the presence and shape of objects that absorb energy form the x-ray beam, but cannot distinguish between benign material and explosive devices. Current QR detection systems are hindered by problems such as inadequate sensitivity, limited operating temperature range, and electrical interference from both internal and external RF sources.

The signal-to-noise ratio (SNR) of a nuclear resonance measurement using QR is proportional to the square-root of the Quality-factor (Q-factor) of the probe. Q-factors are approximately 100 for conventional (non superconducting) metal coils, which severely limits the SNR.

The frequency of the QR response from a particular nitrogen compound is temperature dependent, and existing commercial QR detection systems require that the searched objects be held within small temperature range. Further, the small QR response is easily masked by RF sources, such as AM broadcast stations and engine ignition noises, that are external to the detection system.

In conventional detectors, excitation of a QR response requires the application of a pulsed RF magnetic field within the search volume. The applied RF pulse may excite spurious responses from materials within the search volume that can obscure the QR response, leading to an unacceptably large false alarm rate. Examples of internal noise sources include the decaying magnetic field generated by currents induced within conductive materials located within the search volume, as well as piezoelectric responses from materials within the search volume. In order to excite a QR response, the amplitude of the RF field must be larger than several Gauss over the search region. This level of amplitude requires the use of a costly power amplifier and excitation probe, and exceeds the allowable limits for human exposure.

In contrast, conventional CW detection systems excite a QR response by applying a steady-state RF magnetic field whose amplitude is orders of magnitude smaller than that of pulse excitation systems. As the excitation filed is monochromatic, it must be swept over the spectral region that most likely to contains the QR transition. As a result, conventional CW detection systems achieve a useful SNR at the expense of an impractically large detection time for security applications. The minimum detection time is determined by the bandwidth of a lock-in amplifier, which is often less than one Hertz, resulting in detection times spanning tens of minutes. For this reason detection of explosives using CW QR methods has not been pursued.

SUMMARY OF THE INVENTION

Methods and apparatus are described for QR detection of analytes, such as nitrogen-containing analytes. Embodiments of the present invention combine continuous-wave (CW) excitation with detection of a quadrupole resonance (QR) using a narrowband probe, for example a probe comprising a thin-film high-temperature superconducting (HTS) resonator. The use of the narrowband probe, which does not require a lock-in amplifier, allows detection times to be reduced. Hence, for the first time, a CW QR spectrometer using a HTS probe can be used in a portable security device, such as a hand-held wand for detecting explosives.

QR detectors according to embodiments of the present invention do not require lock-in detectors, as the high Q-factor of an HTS resonator gives a large improvement in the SNR. Analyze detection times may be reduced to less than one minute.

A QR probe is an assembly which may including one or more resonator. A conventional resonator comprises a non-superconducting coil which typically has a low value of Q-factor, such as 100 or less. An HTS resonator typically has a Q-factor of over 10,000, and in some case orders of magnitude greater. The combination of an HTS resonator and CW detection provides remarkable advantages for analyze detection, particularly in security applications. These include low excitation power requirements, fast detection, and noise rejection.

By constructing a CW QR device using a narrowband superconducting resonator, the need for a lock-in amplifier can be eliminated and detection times achieved comparable to pulsed detection systems. A commercial CW detection system has never before been realized, largely because detection using a CW system having a lock-in amplifier detection time may be orders of magnitude larger than for conventional transient detection systems. However, the use of a probe using an HTS resonator allows detection times to be reduced to those reasonable for commercial applications, including security applications.

An example apparatus to assist detection of an analyze within a sample volume using nuclear quadrupole resonance (QR) comprises a continuous wave exciter (such as an oscillator and an excitation coil), a superconducting resonator having a resonance frequency; and a receiver circuit, receiving a signal from the superconducting resonator, the receiver circuit not including a lock-in amplifier. A separate excitation coil may be used, in addition to the superconducting resonator. Alternatively, the superconducting resonator may operate as an exciter, with energy absorption by the analyze detected by the oscillator circuit. The resonance frequency of the superconducting resonator can be adjusted using switched capacitors in a coupled resonator, by mechanical displacement relative to a dielectric wafer, or using another approach. An electronic module may be used to control the resonance frequency of the superconducting resonator and the oscillation frequency of the oscillator.

An example method of detecting an analyze within a search volume comprises exciting the search volume using a continuous-wave oscillator, detecting a QR response signal from the search volume using a superconducting resonator, and adjusting the resonance frequency of the superconducting resonator so as to obtain a QR spectrum of the search volume. The analyze can be detected within the search volume from a QR resonance in the QR spectrum. The temperature of the search volume, determined or estimated, can be used to establish a scanned frequency range, or aid identification or detection of an analyze. The search volume may be excited with an electromagnetic field power of less than 1 W, in some cases less than 500 mW.

BRIEF DESCRIPTION OF THE FIGURES

FIGS. 3A and 3B show bridge and phasor forms of an oscillator circuit, respectively, and FIG. 3C shows an envelope detector;

DETAILED DESCRIPTION OF THE INVENTION

Figure 1:
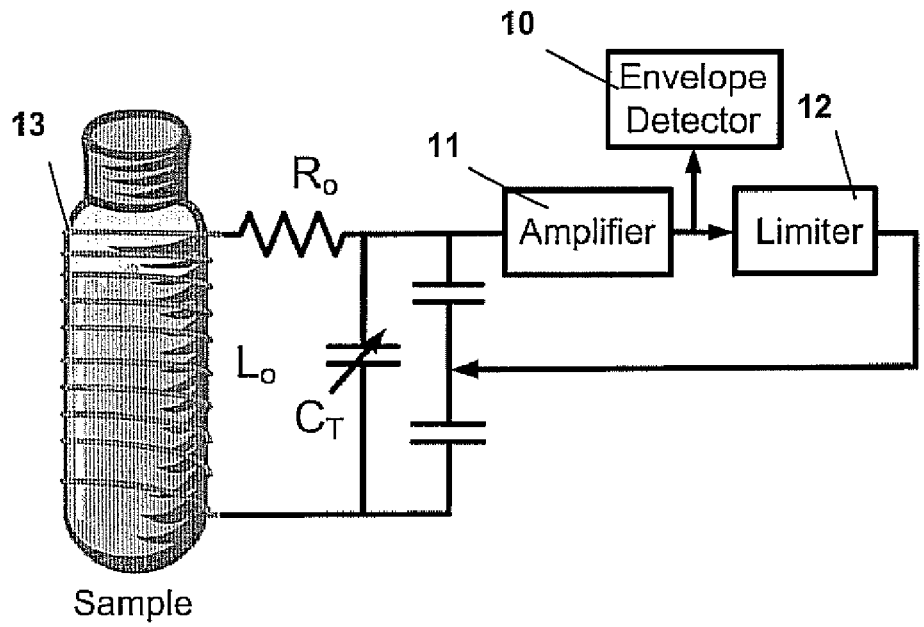
FIG. 1 shows a block diagram of a Robinson-type marginal oscillator detection circuit.

Methods and apparatus are described for detecting nitrogen-containing materials such as explosives using continuous-wave (CW) quadrupole resonance (QR) spectroscopy with a narrowband probe fabricated from a thin-film high-temperature superconducting (HTS) resonator to reduce detection time. A CW QR spectrometer with an HTS probe can be used in systems that detect explosives concealed within containers (such as luggage, mail, improvised explosive devices, and minimal metal landmines), or explosives concealed within a person's clothing.

In a pulsed or transient QR detection, the search region is subjected to a series of RF pulses and a QR response detected in the interval between the RF pulses. Specific nitrogen compounds are detected using a search coil similar to those found in metal detectors. The coil broadcasts short duration radio frequency (RF) pulses and, if a target compound is present, a RF signal is received from nitrogen atoms during the interval between the applied pulses. However, in some situations a high power pulse may cause problems. Pulsed QR detection systems require a RF magnetic pulse whose amplitude is on the order of five Gauss. Generation of a five Gauss field over a search volume (e.g. large enough to contain a few suitcases) presents several challenges. First, a high power RF amplifier is required, along with an excitation probe capable of sustaining high RF voltages and currents, thereby increasing the overall expense of the detection system. Second, the amplitude of the RF pulse is large enough to induce responses from materials within the search volume that may mask the presence of the QR response, such as secondary currents induced in conductive media as well as piezoelectric responses. Third, the amplitude of the RF pulses is too large to search civilians concealing explosives within their clothing.

These concerns may be overcome using continuous-wave detection in conjunction with a narrowband probe, for example a probe using an HTS (high temperature superconductor) resonator.

Compared with QR detection systems that use radio frequency (RF) magnetic pulses, a CW detection system provides significant advantages by requiring substantially lower magnetic field strengths. A CW detection system is inherently less expensive because it does not require a high power amplifier and excitation probe, the applied magnetic fields will not excite spurious responses that increase the false alarm rate, and the small applied magnetic field presents no threat to electronic or biological systems within the search volume.

Continuous-wave (CW) detection of QR signals requires RF fields that are three orders of magnitude smaller than those required for transient detection. As a result, in comparison to transient detection systems, the instrumentation is inexpensive, the applied RF field is too small to generate spurious responses that may mask the presence of a QR response, and the presence of the RE field does not pose a health risk to people or electronic devices located within the search volume.

An advantage of using multi-pulse RF sequences is that they generate multiple QR responses that can be averaged to improve the signal-to-noise ratio of the QR measurement. Some explosives, such as RDX, yield a steady-state waveform between RF pulses, producing an arbitrarily large number of responses for signal averaging. On the other hand, other explosives, such PETN and TNT, have unfavorable relaxation times and will produce only a small number of responses for averaging during the detection period. However, unlike the case of pulsed detection, the relaxation times associated with the QR responses from TNT and PETN will not affect the performance of a CW QR detection system.

A drawback of conventional CW detection systems is that they achieve a high SNR at the expense of an impractically large detection time for security applications. The minimum detection time is set by the bandwidth of a lock-in amplifier, which is often less than one Hertz, resulting in detection times spanning tens of minutes. For this reason detection of explosives using CW QR methods has not been pursued.

The SNR of a CW spectrometer depends on the quality-factor (Q-factor) of the probe containing the sample. Using a conventional (non-superconducting) coil, the Q-factor is on the order of 100. We have recently developed HTS (high temperature superconductor) QR probes with Q-factors in excess of 10,000. By constructing a CW detection system using a high Q-factor probe, it is possible to eliminate the lock-in amplifier and its narrowband filter. As a result, it is now possible to realize an explosive detection system based on CW spectroscopy that has the same detection time as pulse methods, and that presents the advantages afforded through the use of a low power excitation.

Example Oscillator

FIG. 1 shows a block diagram of a CW spectrometer that uses Robinson-type marginal oscillator circuit. The apparatus comprises envelope detector 10, amplifier 11, limiter 12, and coil surrounding sample 13. In a marginal oscillator, the energy feedback to the tuned circuit is kept constant. In other types of oscillator, when there is a drop in the oscillation amplitude, variable feedback gradually restores the amplitude of oscillation to the original value. In a marginal oscillator, however, the amplitude is not restored due to constant feedback. As a result, the amplitude of the oscillations in a marginal oscillator, observed using an envelope detector, provides a measure of the power absorbed by the nuclei. Because a separate circuit is used for the RF amplifier and limiter, the configuration is called a Robinson-type marginal oscillator. The inductance Lo of the probe coil and the capacitance CT sets the excitation frequency. The frequency of the oscillator is wept through a QR transition by varying the capacitance CT.

Figure 2:
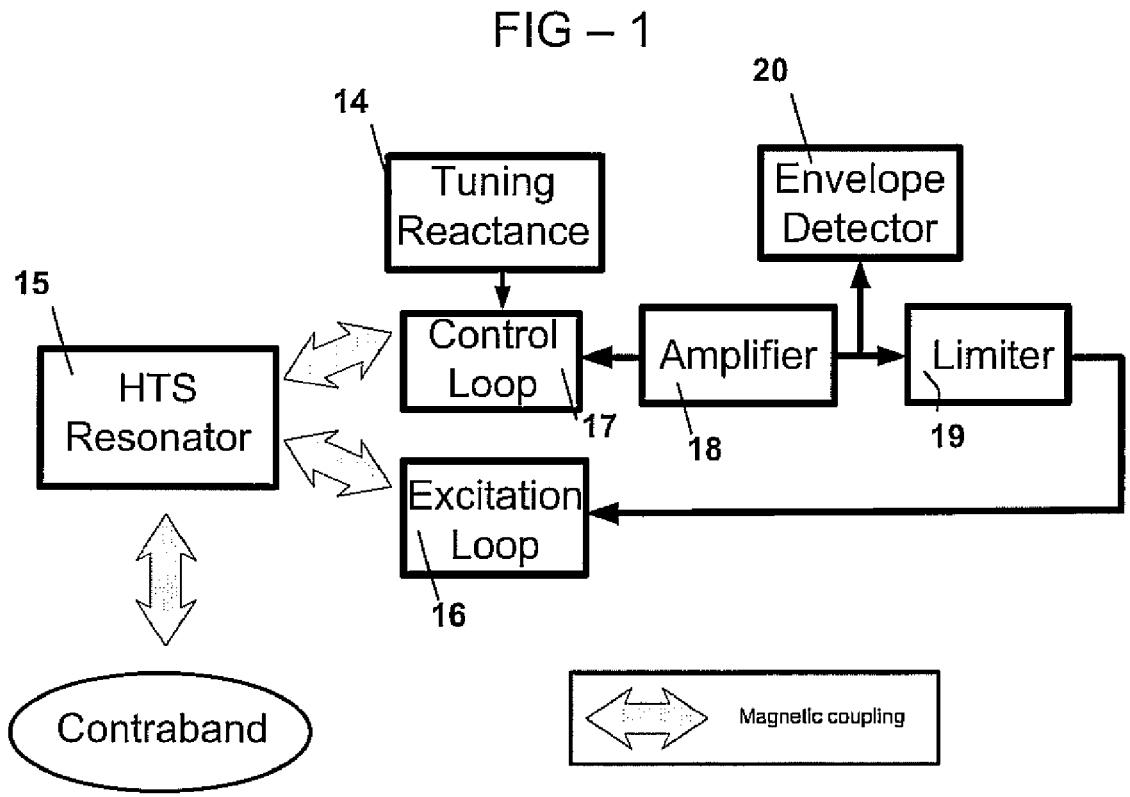
FIG. 2 shows a block diagram of CW QR spectrometer.

FIG. 2 shows a block diagram of a CW spectrometer that uses the Robinson-type marginal oscillator topology in conjunction with a HTS probe. The apparatus comprises tuning reactance 14, HTS probe 15, excitation loop 16, control loop 17, amplifier 18, limiter 19, and envelope detector 20. A control loop magnetically couples a reactance to the HTS resonator to control its frequency, and senses the level of circulating current within the HTS resonator. The excitation loop injects energy into the resonator to sustain a continuous-wave excitation. The amplitude of the current circulating within the HTS resonator decreases as nuclei within the contraband absorb energy at the QR transition frequency. As the frequency of HTS resonator is swept through the region of a QR transition, the envelope detector output reveals the level of oscillation, and hence the absorption of power by the QR transition.

FIG. 3A shows the bridge circuit of a Robinson marginal oscillator in the usual form, and FIG. 3B shows a phasor form of the oscillator circuit which was used in an experiment.

A bridge circuit is generally only used if the probe coil makes direct contact with the tuning capacitor, as with conventional coils. However, this is not the case in preferred embodiments of the present invention using HTS probes.

To balance the bridge and prevent amplitude modulation, the level of the feedback to each end of C1 should be the same, i.e. $V_A = V_B$. It can readily be shown that, assuming $j\omega L$ is large, to balance the bridge requires $C_2 R_2 = C R_1$. As C is the variable tuning capacitor, once $R_1$ and $R_2$ are chosen, C2 must be changed simultaneously with C to continue to maintain the bridge balance. Ganging C and C2 on the shaft and tuning them together achieves this continuous balance. There may still be a slight amplitude modulation that will occur due to the dithering capacitor, which can be reduced by combining this circuit with a bi-directional square-wave circuit.

The tank circuit in this example used a variable 40 pf to 450 pf air capacitor that has two capacitors ganged on the same shaft for the tuning capacitor and C2. The varactor diode used was the MV2109. The values or $R_1$ and $R_2$ are 47 k$\Omega$ and the inductor is the probe coil. The probe coil had an $R_P$ of 100 m$\Omega$, $L_P$ of 7.5 µH, and Q of 200 when in free space.

FIG. 3C shows an envelope detector using a rectifier and band-pass filter to remove the DC offset and high frequency noise.

In one example, the amplifier used was the AD8001, an 800 MHz, 50 mW current-feedback amplifier that presents a very small phase change in the non-inverting configuration, uses a ±5 volts supply rails, and has a very large bandwidth. A limiter was created by using the AD8561, an ultra-fast 7 nanosecond comparator which uses ±5 volts supply rails, has a very small phase shift, and is fast enough to sustain oscillations. The AD8561 comparator was used for the limiter as it gave a guaranteed 0 to 5 volt square wave, ensuring a constant energy feedback independent of the oscillation power. A 10 k$\Omega$ potentiometer inserted into the feedback path allowed for the reduction of the comparator output waveform in a predictable manner from 5V to 0V. The tuned circuit allowed for frequency modulation without amplitude modulation. Power supplies were bypassed with 0.1 microfarad capacitors to ground. The Analog Devices chips need a ground plane on the top of the components so a copper plane tied to ground was on the component side of the board. All leads on the devices were kept as short as physically possible to avoid stray capacitances. The signal paths were kept as far from each other as possible to prevent interference between the signals.

The envelope detector was used for generation of a lock-in amplifier signal input when using a conventional coil, and can also be used with an HTS-based circuit with no lock-in amplifier needed. The signal from the first amplifier stage was multiplied by the output of the limiter, giving a half-wave rectified signal. An AD835 250 MHz multiplier was used and the output is filtered to eliminate the high frequency noise on the signal. Band pass filtering was used to pass just the spectral component of the envelope while blocking high frequency noise and de offset. In this example, the poles of the filter were at 30 Hz and 3000 Hz. This active filter used an OP177 op-amp. In other examples, rectification may be a side effect of limiter construction, for example if a FET or vacuum tube is used.

Oscillator Evaluation Using a Conventional Coil

Figure 4:
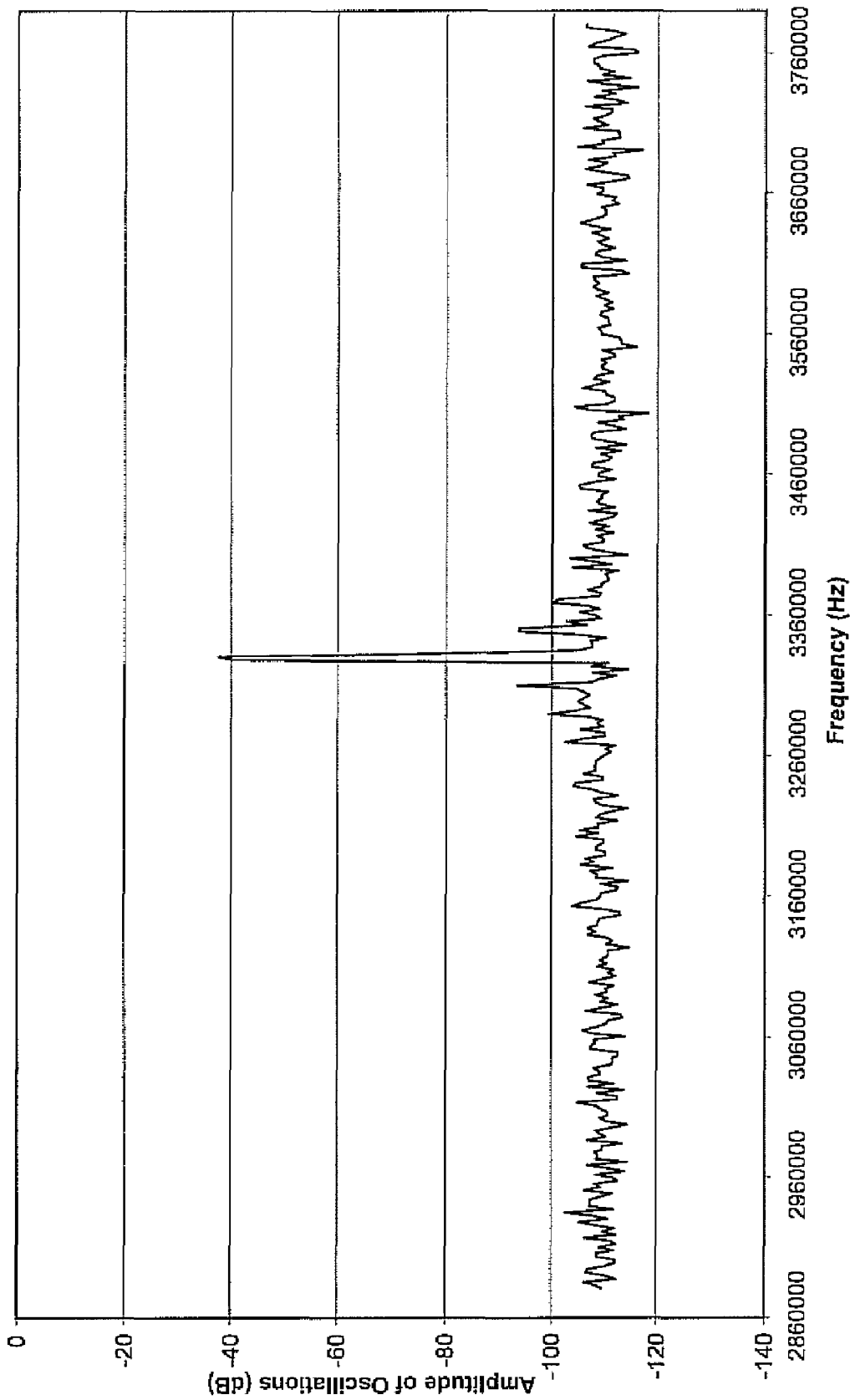
FIG. 4 shows the spectral output of the oscillator using a conventional (non-superconducting) coil.

FIG. 4 shows the high spectral quality of the oscillator output using a conventional coil. For experimental evaluation of the oscillator circuit, a conventional coil was attached to a 33 cm long stainless steel transmission line and placed in the cryostat which makes the $R_P$ seen by the experiment as 2$\Omega$ and $L_P$ as 8.8 µH. The Q of the coil and transmission line in the cryostat is about 100, or half the value in free space. These different values were apparently due shielding and eddy current effects associated the silvered glass in the cryostat. The transmission line used added 0.8$\Omega$ of resistance and 0.8 µH of inductance. Calculations assumed the coil is in the cryostat and at the end of the transmission line. In embodiments of the present invention, this excitation circuitry may be used with an HTS resonator receiver coil to provide an improved QR detection system.

Evaluation of CW Detection Using a Conventional Coil

The following discussion illustrates the feasibility of CW detection of analytes using a conventional coil. Using a conventional coil, a lock-in amplifier was required, as discussed below. However, the use of an HTS resonator further improves detection through elimination of the need for a lock-in amplifier.

A linear detector was used to measure the RF amplitude of oscillation from the resonant circuit, and output a proportional DC voltage. To prevent missed or incorrect lines, the rf oscillator is frequency modulated by a low frequency signal, $f_m$, and phase sensitive detection was used. This modulation causes the changes in the RF amplitude due to QR lines to be a periodic function with period $1/f_m$. A high pass filter can then be used to eliminate the DC portion of the detector output and most of the erroneous RF amplitude shifts giving a clean location of the resonance lines.

Weak frequency modulation was used to reveal the second derivative of the line shape, with amplitude less than the maximum available. Alternatively, strong frequency modulation can be used to display the absorption line at its full intensity and with the actual shape is strong modulation.

In an experiment using a conventional coil, a stepper motor was used to turn a tuning capacitor to each new frequency. The stepper motor was geared down twice by 100 each time to give a step size of 0.00036°. The gear reduction is performed by two miniature right-angle worm gear speed reducers with gear ratios of 100:1 from Allied Devices, Corporation (part number DDQ11). The position of the stepper motor is controlled by three digital output lines from the computer control system through an adapter board made by Modern Technologies. The computer uses the frequency counter to determine the new frequency of oscillation at each step of the motor and can adjust the step size or direction if the steps become too great or overshoot the desired frequency.

The stepper motor can be replaced with electronically tuning of the frequency from 500 kHz through 5 MHz. Rapid and flexible adjustment of the frequency facilitates a nonlinear sweep for the QR transition, for example using an adaptive algorithm for peak-searching.

A frequency counter was used to determine the frequency of the oscillations. A data acquisition board in the computer control system was used for frequency recording and determining the required increment of the tuning capacitor. A frequency divider preceded the frequency counter. The frequency divider circuit used a Motorola SN54197, and takes its input from the inverting output of the comparator. The inverting output of the AD8561 comparator gave a steady TTL compatible signal at the oscillation frequency, but 180° out of phase with the oscillations. Two outputs were taken from the SN54197, the input frequency divided by 8 and the input frequency divided by 16. This gave an accurate value for the resolution of the computer and offered a second larger value to use if the frequency was too low when divided by 16.

An envelope detector was created using a rectifier and band-pass filter to remove the DC offset and high frequency noise. The envelope detector was used for generation of a lock-in amplifier signal input when using a conventional coil. The signal from the first amplifier stage was multiplied by the output of the limiter, giving a half-wave rectified signal. An AD835 250 MHz multiplier was used and the output was filtered to eliminate the high frequency noise on the signal. Band pass filtering was used to pass just the spectral component of the envelope while blocking high frequency noise and dc offset. In this example, the poles of the filter were at 30 Hz and 3000 Hz. This active filter used an OP177 op-amp. In other examples, rectification may be a side effect of limiter construction, for example if a FET or vacuum tube is used. A lock-in amplifier was used for signal detection using a conventional coil. However, a lock-in amplifier is not needed when using an HTS coil.

In this example, using the conventional coil, a decrease in the oscillation amplitude was measured that directly that correlated to an increase in the coil resistance and so to an increase in the $\chi''(\omega)$. The change in the oscillation power was only about 0.002% and this is riding on a 176 mV sine wave use to create the magnetic field. The lock-in amplifier had a very small bandwidth which filtered out most of the noise. A single chip lock in amplifier was used, the AD630 from Analog Devices. This was preceded by a low pass filter that removed noise over 1 kHz, and any remaining noise was removed by a 2 pole low pass filter with one pole set at 1.6 Hz and the other pole set at 1 Hz. The modulation frequency was less then 1 Hz, so that most of the noise was eliminated without removing the desired signal. Using a conventional coil, the SNR was 67 dB with the lock-in amplifier and dropped to about −82 dB without the lock-in amplifier. The circuit used a low noise amplifier and phase detector, and a low pass filter is used to give a DC output signal. The output signal was sent to an analog to digital converter on the data acquisition board in the computer. The computer averaged signals to complete the low pass filtering, and recorded the oscillation frequency and corresponding output signal voltage.

Figure 5:
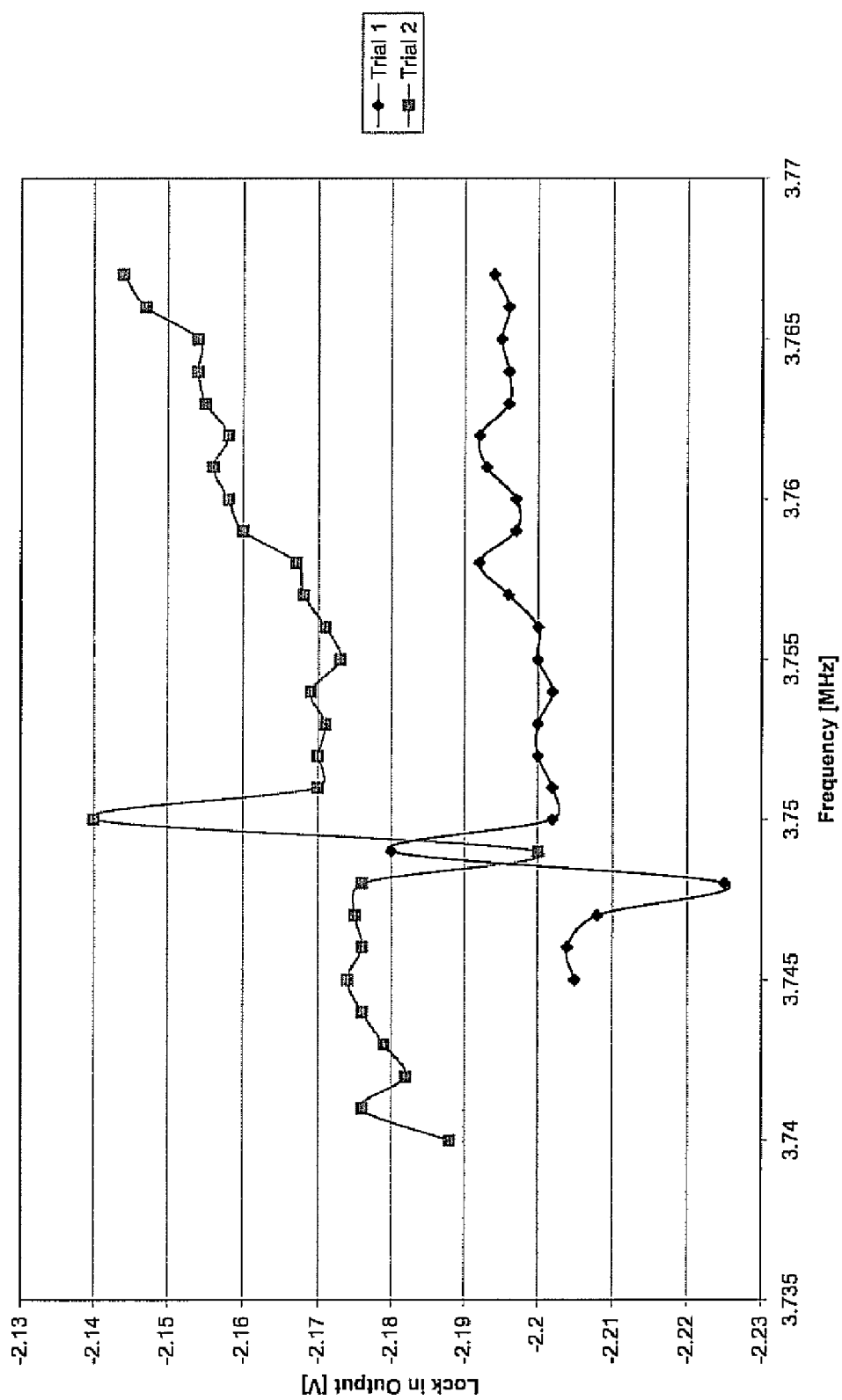
FIG. 5 shows two uncalibrated trial spectra of sodium nitrite using CW QR spectroscopy, using a conventional coil and lock-in detector.

FIG. 5 shows the results of two uncalibrated trial spectra obtained using a 17.9 gram sample of sodium nitrite submerged in liquid nitrogen, using a conventional coil. The first trial resulted in a CW line centered at 3.748 MHz with a signal magnitude of 45 mV. The second trial resulted in a CW line centered at 3.749 MHz with a signal magnitude of 60 mV. The dc voltage levels output from the lock in amplifier were different for the two trials because sample temperature was not controlled. The resonance was also not at the expected value of 3.757 MHz, but this may be adjusted by calibration. The detected signal is a derivative of the actual lineshape, which may be recovered if desired. The CW experiment shows the excellent lineshape data which may be determined, which can be used to eliminated noise signals and reduce false positive detections.

The frequency range of the constructed detector was between 2.47 MHz and 7.089 MHz. The frequency range can be expanded by adding capacitors that may be switched into and out of the circuit, for example parallel with the tuning capacitor (see FIG. 1), and allows a series of frequency ranges to be obtained, for example 500 kHz to 2.5 MHz, 2.5 MHz to 5 MHz, 5 MHz to 10 MHz, and 10 MHz to 50 MHz.

Quadrature phase detection may improve the function of the lock-in amplifier, and may improve the SNR and sensitivity. Further, using a voltage controlled variable gain stage in the feedback loop (in the place of a potentiometer) allows automatic control of the $H_1$ value. The value of the voltage drop over the sample coil may be used to calculate $H_1$, and then determine the gain correction necessary to move the nuclei out of saturation if necessary. This is useful to prevent saturation of samples with large $T_1$ or $T_2$.

HTS Resonators

Resonators were fabricated on a 0.5 mm thick, 50 mm diameter lanthanum aluminate wafer coated on both sides by a film of the thallium-based HTS material $Tl_2Ba_2CaCu_2O_8$ (TBCCO). Films were formed using a sputter deposition of an amorphous precursor film, which does not contain thallium, on the front and back surfaces of the wafer. A subsequent high temperature anneal in a thallium oxide partial pressure forms the epitaxial superconducting phase. The resulting 0.6 micrometer TBCCO films have a critical temperature above 102 K and a surface resistance of 300 microohms measured at 10 GHz.

Figure 6:
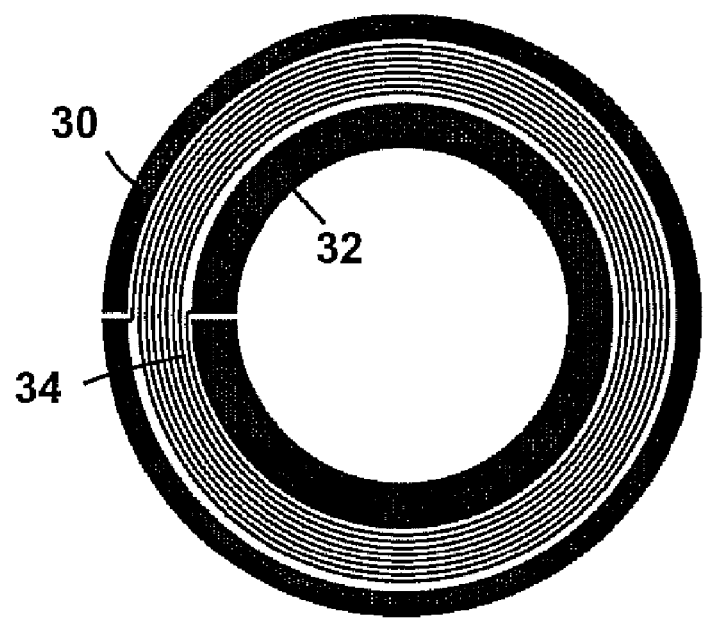
FIG. 6 shows a mask used for fabrication of the superconducting resonator.

FIG. 6 shows a mask used for fabrication of the resonator. The wafer was patterned into a self-resonant device, and the design achieved a desired resonant frequency based on numerical electromagnetic simulations. The mask was exposed on both sides of the wafer with the resulting HTS layers mirrored about the plane of the substrate wafer. As a final step, a thin protective layer of Teflon™ AF was applied to both sides of the finished device. The resulting device is a distributed parameter electrical circuit with multiple resonant modes. The inner and outer annular rings on the HTS mask are patterned opposite one another on both sides of the wafer, forming parallel plate capacitors. The spirals connecting the annular rings each have self inductance and they share mutual inductance as well. Additional inductance and capacitance is distributed throughout the HTS resonator features; for example, the turns of a spiral are capacitively coupled. Preferably, the Q-factor of the HTS resonator is at least 1,000, more preferably at least 10,000. Resonator Q-factors of around 20,000 were obtained.

The structure of FIG. 6 comprises of a thick outer ring (20) and a thick inner ring (22), with an 8 turn spiral (24) connecting the rings. The same structure is etched on opposite sides of a wafer, with the spirals in opposite directions so that the currents are oriented in the same direction for both spirals. The spirals form an inductance, and are terminated with slit annular rings that form an inner and outer capacitance together with the high permittivity, low loss, wafer dielectric. The superconducting material presents some small loss, and the resonator may be modeled as a series RLC circuit A lumped-parameter RLC model may be used as the electrical length of the spirals was less than 25 degrees at the operating frequencies used. This superconducting resonator was successfully used in pulsed QR detection of sodium nitrite.

Frequency Control in a CW System

The scanned frequency range may be selected based on the analyze detection required, and/or the temperature of the analyze.

Coarse tuning of an HTS resonator may be mechanically based, for example through electrical coupling a HTS resonator to a low-loss dielectric wafer, and/or coupling to a second resonator (conventional resonator or HTS resonator). Varying the proximity of a dielectric wafer to a HTS resonator produces a net change in the self-capacitance of the HTS resonator, thereby effecting a change in resonant frequency. Electrical coupling between two HTS resonators results in two resonant peaks whose locations are varied by adjusting the mechanical displacement between the two resonators. Capacitors allow distributed capacitive coupling between the turns of a single coil.

The coarse tuning may be used to track temperature variations of the sample analyze.

Fine tuning of an HTS resonator can be accomplished by magnetically coupling the HTS resonator to a second resonant circuit formed by a loop surrounding the resonator, called a control loop, and an external capacitance. The control loop may be non-superconducting metal (such as copper), or a superconducting metal loop which will avoid lowering the Q-factor of the transmitter. Varying the external capacitance can electrically control the frequency of the HTS probe. The circuit's resonant frequency is determined by its inductance and capacitance. Thus, tuning the circuit's resonant frequency is accomplished by changing either the inductance and/or capacitance. For the HTS resonator, this corresponds to changing the amount of energy stored by the resonator in either its magnetic field and/or its electric field.

The fine tuning may be used to locate a QR resonance peak due to the analyze in a spectrum obtained over the fine-tuning frequency band.

Figure 7:
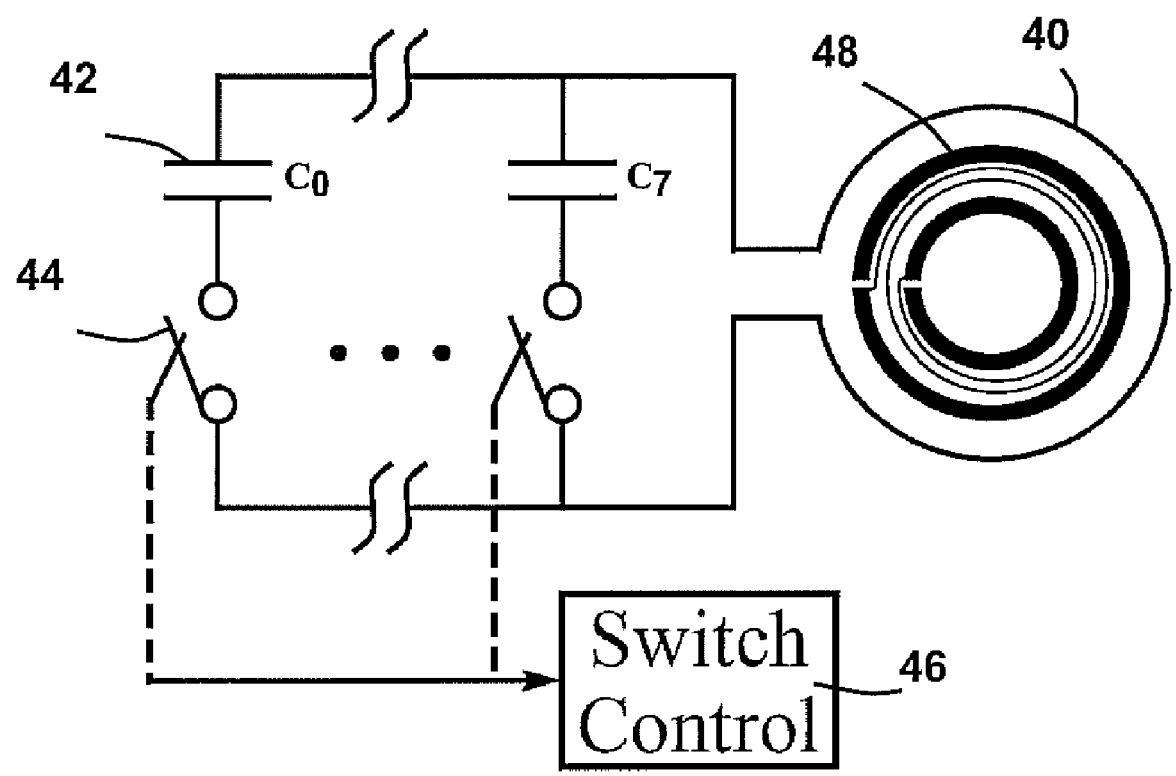
FIG. 7 shows an example schematic for a tuning circuit for frequency control of the superconducting resonator.

FIG. 7 shows an example schematic for a fine tuning circuit. In this example, a conventional (non-superconducting) resonant circuit is used to tune an HTS resonator. The resonant circuit comprises capacitors such as capacitor 42, with associated switches such as switch 44, and a control loop 40 that surrounds the HTS resonator 48. The switch control 46 switches the capacitors $C_0$-$C_7$ in or out of the resonant circuit, allowing fine tuning of the HTS resonator 48. This circuit has been successfully used in pulsed QR experiments. A binary code (such as an 8-bit number) can be used to select capacitors $C_0$-$C_7$ to obtain the desired resonance frequency. The control loop may be a conventional (non-superconducting) loop, such as a copper loop. However, in other examples, the control loop may also be a superconductor.

For CW use, the excitation oscillator frequency may be adjusted in synchronicity with the resonance frequency of the superconducting resonator. For example, binary codes can be used to select capacitance value for the oscillator circuit as well as the resonance frequency adjustment, and the binary codes correlated (for example, identical) so as to obtain similar frequency adjustments.

Coarse frequency adjustments, such as those based on mechanical displacement of the resonator, may be used to select a scanned range, and fine adjustments (such as electrically-controlled adjustments, including those based on switched capacitors in a coupled resonant circuit, or coupling currents) may be used to scan through a desired frequency range.

The scan speed may be adjustable, for example to account for the expected quantity of analyze. A scan may be repeated at a slower scan speed if desired. The scan speed may be substantially constant during a scan, or the scan speed may be variable, for example being slower in regions of particular interest. The scan speed may be reduced if a signal (an apparent QR response) is detected. The frequency may be scanned rapidly to locate possible peaks, with slower scans through identified candidate peaks.

An adaptive algorithm, such as a fuzzy logic algorithm, may be used to determine the scan speed, and/or frequency steps used. The frequency may be changed continuously, for example using an analog controller, or may be stepped through a desired frequency range. The frequency steps may be regular and sequential, or may move through the frequency scan range using an adaptive algorithm to more quickly locate analyze response peaks.

Lineshapes may be determined from detected signals, and used to separate noise peaks from NQR signal peaks. For example, a noise peak is typically narrower than the expected range of QR signal linewidth, and hence lineshape determination may be used to eliminate noise peaks. Expected line positions and linewidths may be stored in a memory, such as a look-up table, as a function of analyze temperature, and used to facilitate analyze detection.

In some examples, the same HTS resonator is used for detection and excitation. However, in other examples, a conventional coil is used for continuous excitation, and an HTS resonator is used for detection. This allows the HTS resonator to be optimized for detection. In other examples, separate HTS coils are used for excitation and detection.

In some examples, an apparatus is provided that performs both pulsed and continuous (CW) NQR detection, depending on user input and/or data collected, and which may switch from one mode of operation to another according to determined analyze relaxation times. Pulsed detection may be relatively less effective for long analyze relaxation times, and in such cases a CW detection mode may be selected.

In some examples, the Q-factor of the HTS resonator may be higher than necessary, and circuitry provided to reduce the Q-factor of the HTS resonator. This may be useful for changing the scanning speed, for example for use in a preliminary scan. For example, additional resistance or coupling coils may be provided to allow the Q-factor to be variable. A HTS resonator may be magnetically coupled to a second resonant circuit, and if the second resonant circuit is lossy, the Q-factor of the HTS resonator is reduced. The maximum Q-factor may be the intrinsic Q-factor of the HTS resonator, for example 20,000 or greater; but using additional circuitry, such as a magnetically coupled lossy resonant circuit, this value may be reduced to any desired value.

Detection Circuit Using an HTS Resonator

An improved continuous-wave (CW) NQR spectrometer can be constructed using a high-temperature superconducting (HTS) probe. The detection sensitivity of a CW QR system with a HTS probe is greater than that of either a CW or pulsed system with a conventional coil.

The oscillator circuit used can be a continuous-wave (CW) sinusoidal oscillator, such as a Colpitts oscillator or similar. The oscillator may similar to that described above in relation to FIG. 1, though other oscillator circuits may be used.

An advantage of using an HTS resonator is that the detection circuit does not require a lock-in amplifier, though one may be used for some applications of the present invention if necessary. However, the analyze detection time is significantly increased if lock-in detection is used.

Figure 8:
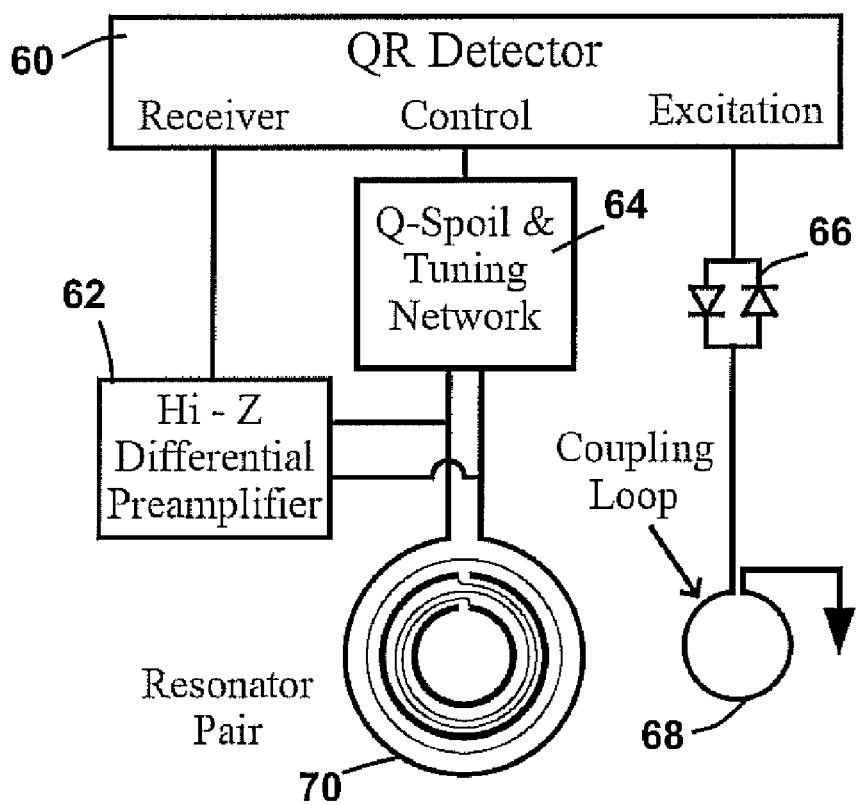
FIG. 8 is a schematic of an apparatus that can be used for CW QR.

FIG. 8 shows a schematic of an apparatus that can be adapted for a QR analyze detection apparatus. This apparatus was used successfully for pulsed QR detection, and may be adapted for CW QR or combined pulsed/CW operation. The apparatus comprises QR detector electronic module 60, which provides excitation signals through the transmitter diode pair 66 to coupling loop 68. The coupling loop is a conventional (non-superconducting) loop inductively coupled to the superconducting resonator, and may substantially encircle the outer ring of the resonator. The electronic module provides control signals to a Q-spoil and tuning circuit 64. The tuning circuit may be for example comprise a switched capacitor array, as discussed above in relation to FIG. 7.

A Q-spoil circuit, comprising resistors or other lossy elements within a resonator circuit coupled to the superconducting resonator, may be used to modify the Q-factor and bandwidth of the resonator. For example, a resonator circuit inductively coupled to the superconducting resonator may include both switched capacitive and switched resistive elements, and be used for resonance frequency tuning and/or Q-factor adjustment of the superconducting resonator. In other embodiments, the resonance frequency may be adjusted continuously during data collection, for example using an analog control circuit.

In pulsed QR, Q-spoil is useful for dissipating energy induced by the excitation pulse in the receiver coil. This is generally not an issue for CW QR. However, adjustment of the Q-factor using Q-spoil circuit allows adjustment of the resonance width of the superconducting resonator. The resonance width may be correlated with the frequency steps used by a frequency controller.

A high-impedance differential amplifier 62 is used to detect the received signal from the resonator 70. In this example, the resonator pair comprises an HTS resonator encircled by a control loop, for example as discussed above in relation to FIG. 7.

For pulsed operation, the transmitter diodes 66 form a passive switch that disconnects the transmitter from the excitation coil during receive mode, and an ENI Model 240L amplifier was used to generate 25 W pulses, with the attenuator set to 13 dB. The transmitter diodes 66 form a passive switch that disconnects the transmitter from the excitation coil during receive mode. This decouples the 50 ohm transmitter impedance from the probe 70 to avoid reduction of the Q-factor, and also decouples noise from the transmitter. An experimental pulsed configuration used an ENI Model 240L amplifier to generate 25 W pulses, with the attenuator set to 13 dB.

However, for CW operation, a CW oscillator is used for excitation of the sample volume, and the diode pair is not needed. Further, a high power amplifier is not needed. In this example, the sample volume is exited by a conventional coil, the coupling loop 68. The power required at any instant is much less than the excitation pulse power required for pulsed QR operation. The coupling loop may be excited by an oscillator, for example as that discussed above in relation to FIG. 1. An electronic module may be configured for both pulsed and CW modes of operation.

The receiver pre-amplifier 62 can be connected to the leads of the inner loop of a dual-loop structure (used as a control loop) surrounding the HTS probe, as shown in FIG. 8. In this specific example, the HTS probe is greatly over-coupled by the control loop and, to avoid significantly lowering the probe's Q-factor, a high input impedance, low noise, RF pre-amplifier can be used, such as an AD8129 Hi-Z differential preamplifier.

Using an impedance matching network between the control loop and the pre-amplifier, a lower input impedance pre-amplifier can be used in this configuration. Further, noise matching of the amplifier may also be accomplished in a similar manner. However, for the matched pre-amplifier to present a sufficiently high impedance through the noise match network, its input impedance magnitude is preferably equal to or greater than its noise match resistance.

The electronic module can be used to control the excitation of the sample volume, resonance frequency and/or Q-factor control of the superconducting resonator, to determine if a signal corresponds to a QR response, select frequency steps to maximize QR response (for example using an adaptive algorithm to speed up peak detection, and other functions. The electronic module may also control coarse tuning of a superconducting resonator, for example using a micro-drive to control the relative offset between a superconducting resonator and a dielectric wafer or other tuning element.

Figure 9:
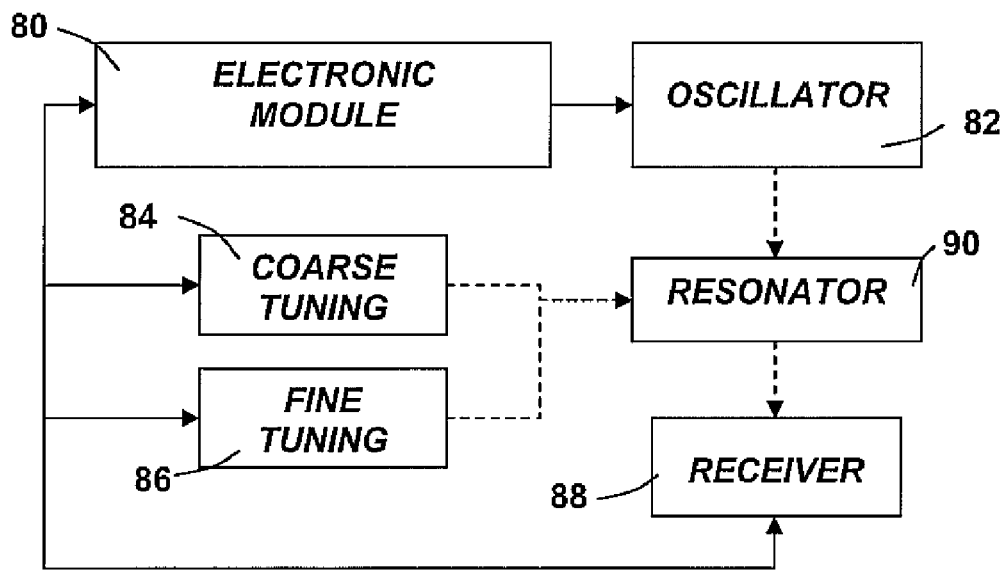
FIG. 9 is a further schematic of an apparatus that can be used for CW QR.

FIG. 9 shows a general schematic of a further apparatus according to an embodiment of the present invention. The apparatus comprises electronic module 80, oscillator 82, coarse tuning 84, fine tuning 86, receiver 88, and superconducting resonator 90. The dashed arrows represent inductive or other indirect electrical coupling, though direct electrical connections may be used in other examples. The oscillator is used to excite a sample volume including the suspected analyze of interest. A conventional coil can be used for excitation. In this example, the superconducting resonator is used for signal detection, and has a resonance frequency that can be modified using the coarse tuning 84 and fine tuning 86. The coarse tuning may include a micrometer drive that induces a relative displacement between the resonator and a tuning element, such as a second resonator or dielectric wafer. The fine tuning may comprise a second resonant circuit, coupled to the superconducting resonator 90, tuning achieved by varying the frequency of the second resonant circuit, for example as discussed in relation to FIG. 7. The receiver comprises a high-impedance amplifier, detecting a receiver signal. The receiver may include a receiver coil, such as a loop inductively coupled to the resonator, and which may be a conventional coil.

In other examples, the resonator may be part of the oscillator circuit, and the receiver may be coupled to the oscillator circuit, for example to detect energy loss in the resonator due to a QR response.

A CW QR detection system uses applied RF magnetic fields that, in comparison to the RF fields used in pulsed detection systems, requires less expensive instrumentation, does not excite spurious signals that can mask the QR response, and poses no health hazardous to people or electronics located within the search volume. By recovering the spectral shape of the QR response, a CW detection system can reduce false alarms caused by the presence of external sources of RF interference. Further, a CW QR detection system may be less affected by the uncertainty in the temperature of the analyze than a pulsed system.

Applications

Applications include aviation security, scanning packages moving through subway and bus terminals, mine countermeasures, detection of improvised explosive devices, medical imaging, anthrax detection, and scanning vehicles for explosives.

Embodiments of the present invention include hand-held and/or portable devices. A conventional pulsed QR detector typically weighs around 200 pounds. Using a CW excitation HTS probe, the apparatus may be in the form of a hand-wand, backpack, case, or other readily carried portable form.

Patents, patent applications, or publications mentioned in this specification are incorporated herein by reference to the same extent as if each individual document was specifically and individually indicated to be incorporated by reference.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

I claim:

1. An apparatus to assist detection of an analyte within a sample volume using nuclear quadrupole resonance, the apparatus comprising:
    a continuous wave exciter;
    a superconducting resonator having a resonance frequency; and
    a receiver circuit, receiving a signal from the superconducting resonator, the receiver circuit not including a lock-in amplifier,
    the apparatus being a nuclear quadrupole resonance (NQR) spectrometer,
    the resonance frequency of the superconducting resonator being adjustable so as to obtain a continuous-wave nuclear quadrupole resonance (CW-NQR) spectrum of the sample volume.

2. The apparatus of claim 1, further including an excitation coil separate from the superconducting resonator, the continuous wave exciter energizing the excitation coil;
    the superconducting resonator operating as a receiver coil.

3. The apparatus of claim 1, wherein the continuous wave exciter comprises a continuous wave oscillator and a non-superconducting coupler coil.

4. The apparatus of claim 3, wherein the resonance frequency of the superconducting resonator is adjustable using an array of switched capacitors in a coupled resonator.

5. The apparatus of claim 4, wherein the oscillation frequency of the oscillator is adjustable using a second array of switched capacitors, the oscillation frequency of the oscillator being correlated with the resonance frequency.

6. The apparatus of claim 1, further comprising an electronic module, the electronic module controlling the resonance frequency of the superconducting resonator.

7. The apparatus of claim 1, wherein the apparatus is in the form of a portable device.

8. A method of detecting an analyte within a search volume, the search volume including a volume in transit using commercial transportation, the method comprising:
    exciting the search volume using a continuous-wave oscillator;
    detecting a QR response signal from the search volume using a superconducting resonator, the superconducting resonator having a resonance frequency;
    obtaining a continuous-wave nuclear quadrupole resonance spectrum (CW-NQR spectrum) of the search volume by adjusting the resonance frequency of the superconducting resonator;
    identifying a quadrupole resonance of the analyte within the CW-NQR spectrum of the search volume; and
    detecting the analyte within the search volume using the quadrupole resonance in the CW-NQR spectrum.

9. The method of claim 8, further comprising determining a temperature of the search volume, wherein:
    detecting the analyte within the search volume comprises comparing a frequency of the QR resonance to an expected frequency for the analyte at the temperature of the search volume.

10. The method of claim 8, further comprising determining a lineshape of the QR resonance, wherein:
    detecting the analyte within the search volume comprises comparing the lineshape of the QR resonance to an expected lineshape for the analyte.

11. The method of claim 8, wherein the search volume is excited with an electromagnetic field power of less than 1 W.

* * * * *

UNITED STATES PATENT AND TRADEMARK OFFICE
CERTIFICATE OF CORRECTION

PATENT NO. : 7,511,496 B2
APPLICATION NO. : 11/679575
DATED : March 31, 2009
INVENTOR(S) : Jeffrey L. Schiano It is certified that error appears in the above-identified patent and that said Letters Patent is hereby corrected as shown below:

Col. 1, line 32: replace "form" with --from--
Col. 1, line 67: replace "filed" with --field--
Col. 2, line 2: replace "likely to contains" with --likely contains--
Col. 2, line 30: replace "may including" with --may include--
Col. 2, line 51: replace "an analyze" with --an analyte--
Col. 2, line 60: replace "the analyze" with --the analyte--
Col. 3, line 1: replace "an analyze" with --an analyte--
Col. 3, line 7: replace "The analyze" with --The analyte--
Col. 3, line 11: replace "an analyze" with --an analyte--
Col. 4, line 23: replace "RE field" with --RF field--
Col. 5, line 8: replace "wept through" with --swept through--
Col. 6, line 16: replace "DE offset" with --dc offset--
Col. 7, line 35: replace "de offset" with --dc offset--
Col. 7, line 43: delete second occurrence of "that"
Col. 7, line 47: replace "wave use to" with --wave used to--
Col. 8, line 11: replace "to eliminated" with --to eliminate--
Col. 9, line 10: replace "analyze" with --analyte--
Col. 9, line 11: replace "analyze" with --analyte--
Col. 9, line 26: replace "analyze" with --analyte--
Col. 9, line 42: replace "analyze" with --analyte--
Col. 10, line 6: replace "analyze" with --analyte--
Col. 10, line 21: replace "analyze" with --analyte--
Col. 10, line 28: replace "analyze" with --analyte--
Col. 10, line 29: replace "analyze" with --analyte--
Col. 10, line 41: replace "analyze" with --analyte--
Col. 10, line 42: replace "analyze" with --analyte--
Col. 10, line 66: replace "may similar" with --may be similar--
Col. 11, line 4: replace "analyze" with --analyte--
Col. 11, line 7: replace "analyze" with --analyte--
Col. 11, line 58: replace "exited" with --excited--
Col. 12, line 34: replace "analyze" with --analyte--

UNITED STATES PATENT AND TRADEMARK OFFICE
CERTIFICATE OF CORRECTION

PATENT NO. : 7,511,496 B2
APPLICATION NO. : 11/679575
DATED : March 31, 2009
INVENTOR(S) : Jeffrey L. Schiano It is certified that error appears in the above-identified patent and that said Letters Patent is hereby corrected as shown below:

Col. 12, line 57: replace "hazardous" with --hazards--
Col. 12, line 63: replace "analyze" with --analyte--

Signed and Sealed this

Thirtieth Day of June, 2009

JOHN DOLL
*Acting Director of the United States Patent and Trademark Office*